United States Patent
Guyomard et al.

(10) Patent No.: US 11,848,218 B2
(45) Date of Patent: Dec. 19, 2023

(54) SEMICONDUCTOR CHAMBER COMPONENT CLEANING SYSTEMS

(71) Applicant: Applied Materials, Inc., Santa Clara, CA (US)

(72) Inventors: Katty Guyomard, Los Altos, CA (US); Chidambara A. Ramalingam, Fremont, CA (US); Shawyon Jafari, Sunnyvale, CA (US); Palash Joshi, Bangalore (IN); Moin Ahmed Khan, Bangalore (IN); Kirubanandan Naina Shanmugam, Bangalore (IN); Subhaschandra Shreepad Salkod, Bangalore (IN); Avishek Ghosh, Espoo (FI); David W. Groechel, Sunnyvale, CA (US); Li Wu, Fremont, CA (US); Dorothea Buechel-Rimmel, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 52 days.

(21) Appl. No.: 17/077,711

(22) Filed: Oct. 22, 2020

(65) Prior Publication Data
US 2022/0130692 A1   Apr. 28, 2022

(51) Int. Cl.
*H01L 21/67* (2006.01)
*B08B 3/04* (2006.01)

(52) U.S. Cl.
CPC ........ *H01L 21/67057* (2013.01); *B08B 3/048* (2013.01)

(58) Field of Classification Search
CPC ......... H01L 21/67057; H01L 21/68735; H01L 21/6719; H01L 21/6704; H01L 21/67051;
(Continued)

(56) References Cited

U.S. PATENT DOCUMENTS 5,688,322 A * 11/1997 Motoda ................... G03F 7/162
118/500
2007/0089767 A1* 4/2007 Yamamoto ................ B08B 3/02
134/137
(Continued)

FOREIGN PATENT DOCUMENTS

JP       05299382 A  * 11/1993
KR    20120055786 A  *  6/2012
WO   WO-9954920 A2  * 10/1999 ........... C25D 17/001

OTHER PUBLICATIONS

Machine translation KR2012-0055786A (Year: 2012).*
Machine translation JP05-299382A (Year: 1993).*

*Primary Examiner* — Douglas Lee
(74) *Attorney, Agent, or Firm* — Kilpatrick Townsend & Stockton LLP

(57) ABSTRACT

Exemplary semiconductor chamber component cleaning systems may include a receptacle. The receptacle may include a bottom lid that may be an annulus. The annulus may be characterized by an inner annular wall and an outer annular wall. A plurality of recessed annular ledges may be defined between the inner annular wall and the outer annular wall. Each recessed annular ledge of the plurality of recessed annular ledges may be formed at a different radial position along the bottom lid. The cleaning systems may include a top lid removably coupled with the bottom lid about an exterior region of the top lid. The cleaning systems may include a tank defining a volume to receive the receptacle.

11 Claims, 5 Drawing Sheets

(58) Field of Classification Search
CPC ......... H01L 21/67028; H01L 21/67253; H01L 21/68785; B08B 3/048
See application file for complete search history.

(56) References Cited

U.S. PATENT DOCUMENTS

2012/0216833 A1\* 8/2012 Wang ................ H01L 21/67288
134/109
2015/0027492 A1\* 1/2015 Takiguchi ......... H01L 21/68792
15/88.1
2017/0299487 A1\* 10/2017 Wang ....................... G01N 1/38

\* cited by examiner

SEMICONDUCTOR CHAMBER COMPONENT CLEANING SYSTEMS

TECHNICAL FIELD

The present technology relates to components and apparatuses for semiconductor component manufacturing. More specifically, the present technology relates to systems and methods for cleaning semiconductor chamber components.

BACKGROUND

Integrated circuits are made possible by processes which produce intricately patterned material layers on substrate surfaces. Producing patterned material on a substrate requires controlled methods for forming and removing material. Components within the processing chamber may impact uniformity of material delivery through channels and apertures formed through the components. When these components are machined, hundreds or thousands of holes may be formed through the component, many of which may be sized relatively small to operate as a choke on delivery, which may facilitate lateral or radial distribution. While these components may be cleaned subsequent the manufacturing process, residual microscopic particles may be retained within the apertures. These particles may dislodge during processing, and may fall onto a substrate being processed.

As these particles may be metal particles from the manufacturing process, the particles may be conductive, which may cause shorting or other damage to the substrate being processed. Thus, there is a need for improved systems and methods that can be used to produce high quality components for semiconductor processing. These and other needs are addressed by the present technology.

SUMMARY

Exemplary semiconductor chamber component cleaning systems may include a receptacle. The receptacle may include a bottom lid that may be an annulus. The annulus may be characterized by an inner annular wall and an outer annular wall. A plurality of recessed annular ledges may be defined between the inner annular wall and the outer annular wall. Each recessed annular ledge of the plurality of recessed annular ledges may be formed at a different radial position along the bottom lid. The cleaning systems may include a top lid removably coupled with the bottom lid about an exterior region of the top lid. The cleaning systems may include a tank defining a volume to receive the receptacle.

In some embodiments, the receptacle may include a plurality of flexible seals. Each seal of the plurality of flexible seals may be positioned along an associated recessed annular ledge of the plurality of recessed annular ledges. The receptacle may include a hermetic seal disposed between the bottom lid and the top lid. The top lid may define a plurality of apertures within an interior region of the top lid. The plurality of apertures may include a central aperture defined through the top lid. The receptacle may include one or more studs extending through one or more apertures of the plurality of apertures defined within the top lid. The one or more apertures of the plurality of apertures may separate from the central aperture defined through the top lid. The bottom lid may include a plurality of holders extending from the bottom lid. The semiconductor chamber component cleaning system may include a mounting beam extending across the tank. The mounting beam may include a plurality of arms coupling the plurality of holders with the mounting beam. The tank may include a cleaning tank defining a plurality of sections. The cleaning tank may include one or more walls fluidly separating the plurality of sections. The plurality of sections may include a cleaning section configured to receive the receptacle. The plurality of sections may include a delivery section. The plurality of sections may include an overflow section. The systems may include a fluid delivery system including a fluid delivery pump. The fluid delivery system may include a filtration tank. The fluid delivery system may include a fluid testing system.

The fluid testing system may include a sampling tank. The fluid testing system may include a liquid particle counter. The systems may include pump piping coupling the fluid delivery pump with each of the cleaning section, the delivery section, and the overflow section of the cleaning tank. The systems may include filtration receiving piping coupling the filtration tank with each of the cleaning section and the overflow section of the cleaning tank. The systems may include filtration delivery piping coupling the filtration tank with each of the cleaning section and the delivery section of the cleaning tank. The systems may include a set of valves operable to configure the fluid delivery system in a push delivery fluid setup and a pull delivery fluid setup. A receiving line of the sampling tank may be fluidly coupled with the cleaning section of the cleaning tank both fluidly upstream and fluidly downstream from a position of the receptacle when incorporated within the cleaning tank. A delivery line of the sampling tank may be fluidly coupled with the overflow section of the cleaning tank.

Some embodiments of the present technology may encompass methods of cleaning a semiconductor chamber component. The methods may include pushing a cleaning fluid through a receptacle in which the semiconductor chamber component is disposed. The methods may include pulling a cleaning fluid through the receptacle in which the semiconductor chamber component is disposed. The methods may include removing a portion of the cleaning fluid from a cleaning tank in which the receptacle is incorporated. The methods may include passing the cleaning fluid through a liquid particle counter.

In some embodiments, the receptacle may include a bottom lid including an annulus. The annulus may be characterized by an inner annular wall and an outer annular wall. A plurality of recessed annular ledges may be defined between the inner annular wall and the outer annular wall. Each recessed annular ledge of the plurality of recessed annular ledges may be formed at a different radial position along the bottom lid. The receptacle may include a top lid removably coupled with the bottom lid about an exterior region of the top lid. The methods may include vertically agitating the receptacle within the cleaning tank. The cleaning fluid may include ultrapure water or deionized water. The pushing or the pulling may be performed at flow rates greater than or about 4 liters per minute. The cleaning tank may define a plurality of sections. The cleaning tank may include one or more walls fluidly separating the plurality of sections. The plurality of sections may include a cleaning section configured to receive the receptacle. The plurality of sections may include a delivery section. The plurality of sections may include an overflow section.

The cleaning tank may be incorporated within a cleaning system. The cleaning system may include a fluid delivery system including a fluid delivery pump. The fluid delivery system may include a filtration tank. The cleaning system may include a fluid testing system including a sampling tank. The fluid testing system may include a liquid particle counter. A receiving line of the sampling tank may be fluidly coupled with the cleaning section of the cleaning tank both above and below a position of the receptacle when incorporated within the cleaning tank. A delivery line of the sampling tank may be fluidly coupled with the overflow section of the cleaning tank.

Some embodiments of the present technology may encompass semiconductor chamber component cleaning systems. The systems may include a receptacle including a bottom lid. The receptacles may include a top lid removably coupled with the bottom lid about an exterior region of the top lid. The systems may include a tank defining a volume to receive the receptacle. The tank may include a cleaning tank defining a plurality of sections. The cleaning tank may include one or more walls fluidly separating the plurality of sections. The plurality of sections may include a cleaning section configured to receive the receptacle. The plurality of sections may include a delivery section. The plurality of sections may include an overflow section. In some embodiments, the systems may include a fluid delivery system including a fluid delivery pump. The fluid delivery system may include a filtration tank. The systems may include a fluid testing system including a sampling tank. The fluid testing system may include a liquid particle counter.

Such technology may provide numerous benefits over conventional systems and techniques. For example, embodiments of the present technology may provide systems that allow multiple cleaning operations to improve particle removal. Additionally, by utilizing systems according to embodiments of the present technology, particle counts during semiconductor processing may be reduced compared to conventional systems. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing may include a number of process operations to produce intricate patterns of materials on a substrate. The chambers in which processing occurs may include chamber components for distributing precursors or reaction materials through the chamber and to distribute them more uniformly across the substrate surface. One such component is a faceplate or showerhead, which may define thousands of holes to facilitate uniform distribution into a processing region of a semiconductor processing chamber.

When these components are fabricated, cleaning processes may be performed to remove manufacturing residues. Additional cleaning operations may then be performed including acid washing, ultrasonic bath washing, and spraying, which may remove particulate matter from the component. However, these conventional cleaning processes may be insufficient for removing particulate matter retained within the apertures of the component. As device sizes continue to shrink, these microscopic particles may be more likely to cause damage or shorting on the substrate.

The present technology may overcome these deficiencies in conventional cleaning by utilizing cleaning systems that include push and pull fluid delivery that may be flowed through the apertures of the component. A detection system incorporated with the cleaning system may be used to determine particle counts of fluid delivered through the component to determine when cleaning has been completed. By using cleaning systems according to embodiments of the present technology, improved particle control may be provided, which may reduce fall-on particles from chamber components.

Although the remaining disclosure will routinely identify specific faceplate cleaning examples, it will be readily understood that the systems and methods are equally applicable to other chamber components that may be cleaned in systems according to embodiments of the present technology. Accordingly, the technology should not be considered to be so limited as for use with these specific chamber components alone. The disclosure will discuss one possible system configuration including several components according to embodiments of the present technology, although it is to be understood that any number of variations may be performed while remaining encompassed by the present technology.

Figure 1A:
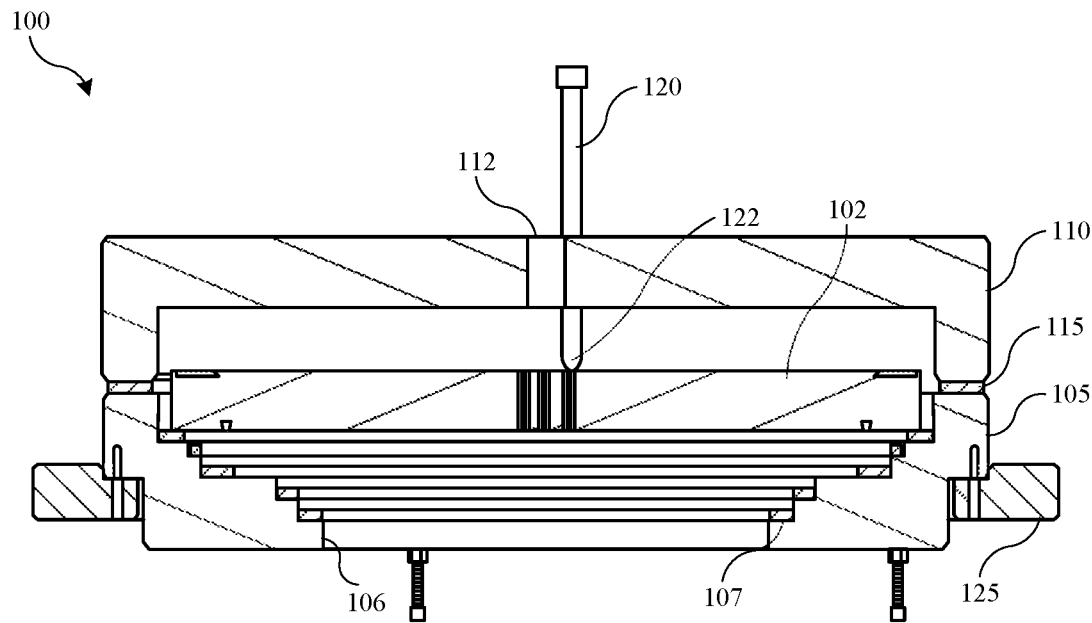
FIG. 1A shows a schematic cross-sectional elevation view of an exemplary component receptacle according to some embodiments of the present technology.

FIG. 1A shows a schematic cross-sectional elevation view of an exemplary component receptacle 100 according to some embodiments of the present technology. Receptacle 100 may be incorporated within a cleaning system, which may allow cleaning of chamber components housed within the receptacle. The receptacle may define a fluid path that may allow control of fluid delivery to be forced through defined channels or apertures of the component, which may ensure adequate flushing to remove particulate matter from the component. As noted above, although the receptacle and overall system will be described in relation to a faceplate being cleaned, it is to be understood that any number of chamber components may be cleaned according to embodiments of the present technology.

Receptacle 100 may define an interior volume in which a component may be disposed, such as a faceplate 102. The receptacle may include a bottom lid 105 and a top lid 110, although any number of components may be included to accommodate faceplates or other chamber components. For example, one or more spacers, such as annular spacers, may be incorporated between the top lid and the bottom lid to accommodate larger faceplate or component sizes. Bottom lid 105 of the receptacle may define an aperture 106 through the bottom of the lid and receptacle, which may allow fluid flow into and out of the receptacle. Accordingly, in some embodiments, bottom lid 105 may be characterized by an annular shape, and receptacle 100 may be substantially open through a bottom surface, although in some embodiments a screen or diffuser may be incorporated across the aperture 106. The bottom lid 105 may be characterized by an inner annular wall, which may define a radius of the outlet of the receptacle, and size of aperture 106. The bottom lid 105 may also be characterized by an outer annular wall. Between the inner annular wall and the outer annular wall may be a number of recessed ledges 107, which may define a number of tiered annular levels at different radial positions and vertical locations between the inner annular wall and the outer annular wall. In embodiments, any number of ledges may be included, such as a single ledge for a single component coverage, or multiple ledges for accommodating any number of components characterized by any number of diameters. The ledges may be formed to allow seating for a number of components for cleaning, while not impeding flow through the component. For example, the ledges may be formed at intervals that may be related to specific component sizes, such as faceplates for a 300 mm substrate and a 200 mm substrate, as well as for different processing chambers that may be characterized by different outer dimensions.

Receptacle 100 may also include a top lid 110, which may be removably coupled and sealingly coupled with bottom lid 105. The lids may be coupled about an exterior region of the lids, which may at least partially define the volume within the receptacle. Positioned between the top lid and the bottom lid may be a seal 115, which may allow the lids to be hermetically sealed about the coupling location of the two lids. Top lid 110 may define one or more apertures, including a plurality of apertures through the top lid. Some of these apertures may be formed through an interior region of the top lid, and some may be formed about an exterior region for coupling the top lid with the bottom lid, for example. Within the interior region, such as along a central axis through the top lid, may be defined a central aperture 112, which may at least partially define a fluid path through the receptacle 100 with aperture 106 of the bottom lid. The fluid path may be further defined through the component within the chamber, which may define the fluid path through the apertures of channels of the component sought to be cleaned in some embodiments.

A number of additional apertures may be defined through the top lid, which may provide access for one or more studs 120, which may be used to seat the component to be cleaned within the receptacle. Although a single stud 120 is shown included, any number of studs may be included through the interior region of the top lid, which may ensure stability of the component during fluid delivery through the component. For example, in some embodiments three or more studs may be extended through the top plate at regular intervals and at a set radius from a central axis through the top lid, which may ensure the component is held in position during cleaning. The studs may be threaded through the top lid 110 for example, or one or more detent mechanisms may be incorporated with each stud to provide preset locations at which the studs may be held, and which may allow a common force to be applied at each location. Each stud 120 may include a deformable or flexible tip 122, which may ensure that as force is applied to the component, the studs may not damage the component being held in place.

Figure 1B:
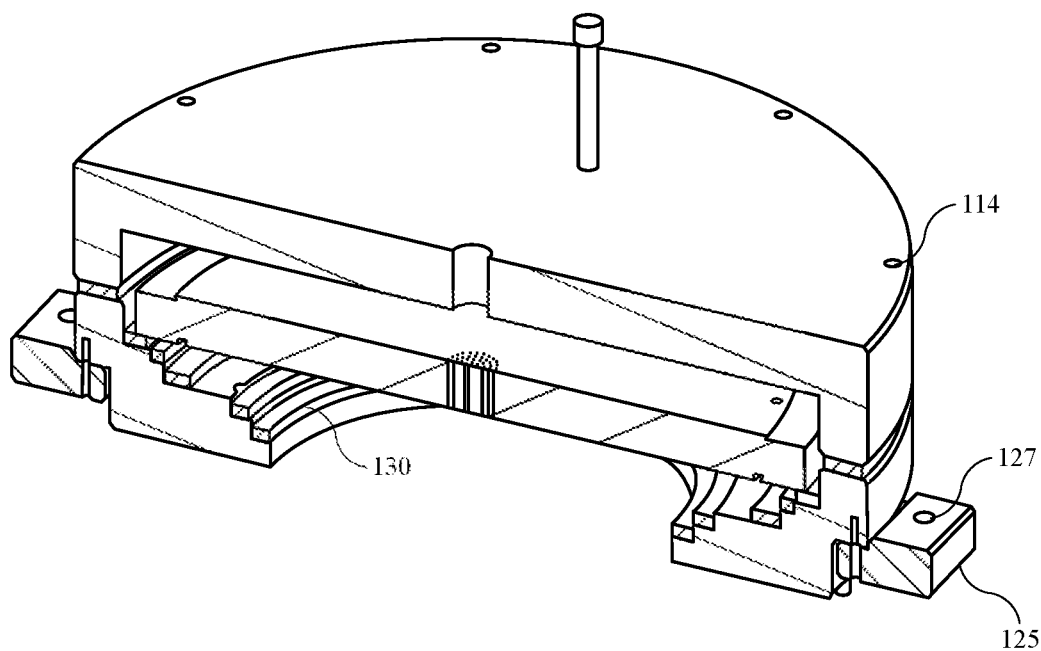
FIG. 1B shows a schematic cross-sectional perspective view of an exemplary component receptacle according to some embodiments of the present technology.

FIG. 1B shows a schematic cross-sectional perspective view of exemplary component receptacle 100 according to some embodiments of the present technology, and may illustrate additional details of the component. For example, as shown, a number of apertures 114 may be formed through an exterior region of the top lid, which may allow the top lid to be secured to the bottom lid to provide a hermetic seal between the lids. Additionally, a flexible seal 130 may be disposed on each recessed ledge 107 of the bottom lid, which may allow the studs 120 to compress the component against the seal of the associated ledge, and ensure a fluid path may be controlled through apertures or channels through the component to be cleaned. Consequently, a fluid path may be maintained through the component apertures or channels, as fluid may be delivered and/or received through aperture 112 of the top lid and aperture 106 of the bottom lid, in embodiments of the present technology. Hence, in some embodiments fluid flow may be limited or prevented from traveling through the receptacle except through the component being cleaned. Bottom lid 105 may also define a recessed ledge extending up from the bottom surface, which may create a rim on which one or more holders 125 may be disposed. Holders 125 may define one or more apertures 127, which may receive arms from a mounting beam as will be described further below.

Figure 2:
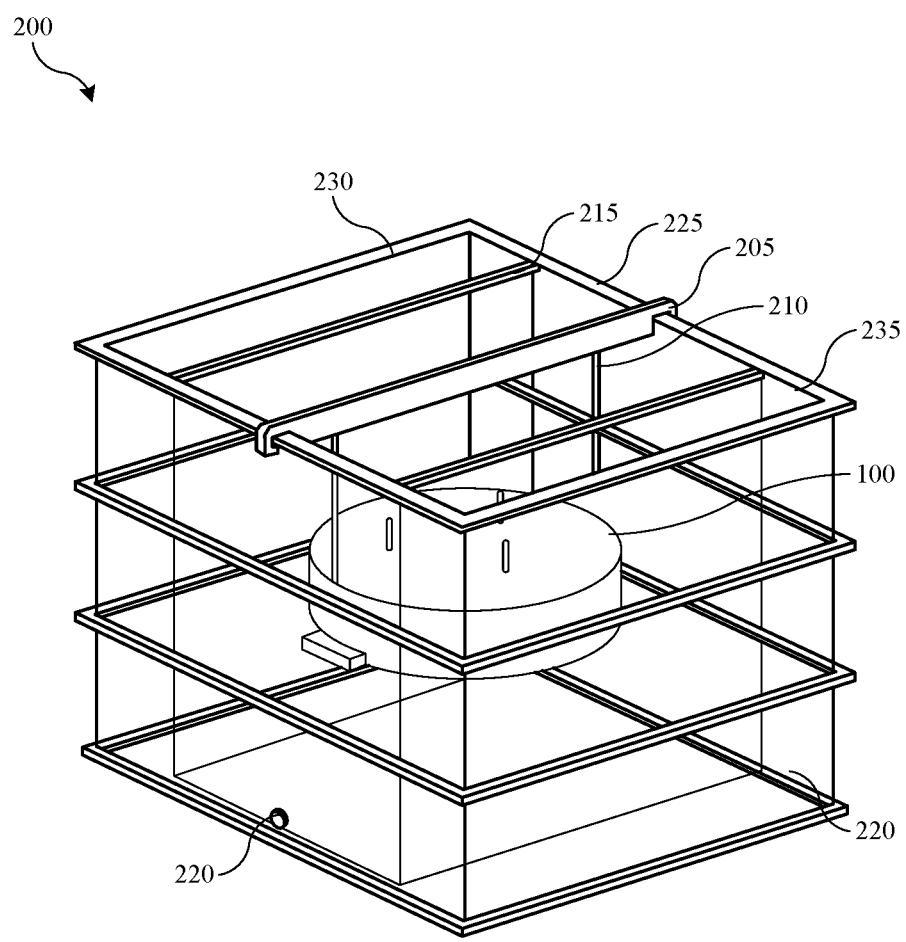
FIG. 2 shows a schematic perspective view of components of an exemplary cleaning tank according to some embodiments of the present technology.

As described above, chamber components may be cleaned in a cleaning system in which the receptacle 100 described above may be incorporated. FIG. 2 shows a schematic perspective view of components of an exemplary cleaning tank 200 according to some embodiments of the present technology, and which may be part of a cleaning system as described throughout the present disclosure. As illustrated, the tank 200 may receive receptacle 100 in an internal volume defined by the tank. A mounting beam 205 may extend across the tank walls as illustrated, and may suspend receptacle 100 within a section of the tank. A number of arms 210 may extend from the mounting beam 205, and may couple with holders of the receptacle as discussed above. Although two such arms and holders are illustrated, it is to be understood that any number of holders and arms may be included to secure the receptacle while extended within the tank.

Tank 200 may be a cleaning tank incorporated within the cleaning system, which will be described in further detail below. As illustrated, the tank may include a number of walls and dividers to create a number of sections within the tank. Interior walls 215 may be disposed within the tank body, and may fluidly separate the sections of the tank. A number of ports 220 or fluid connections may be made through the exterior walls of the tank body, which may allow for fluid delivery and recovery from the various sections of the tank. As shown, tank 200 may include multiple sections that may be used to accommodate cleaning operations described in detail below. For example, tank 200 may include or define a cleaning section 225, which may be sized or otherwise configured to receive the receptacle 100 as illustrated. One or more additional sections may also be included, such as a delivery section 230, and an overflow section 235, which will be described in additional detail below.

Figure 3:
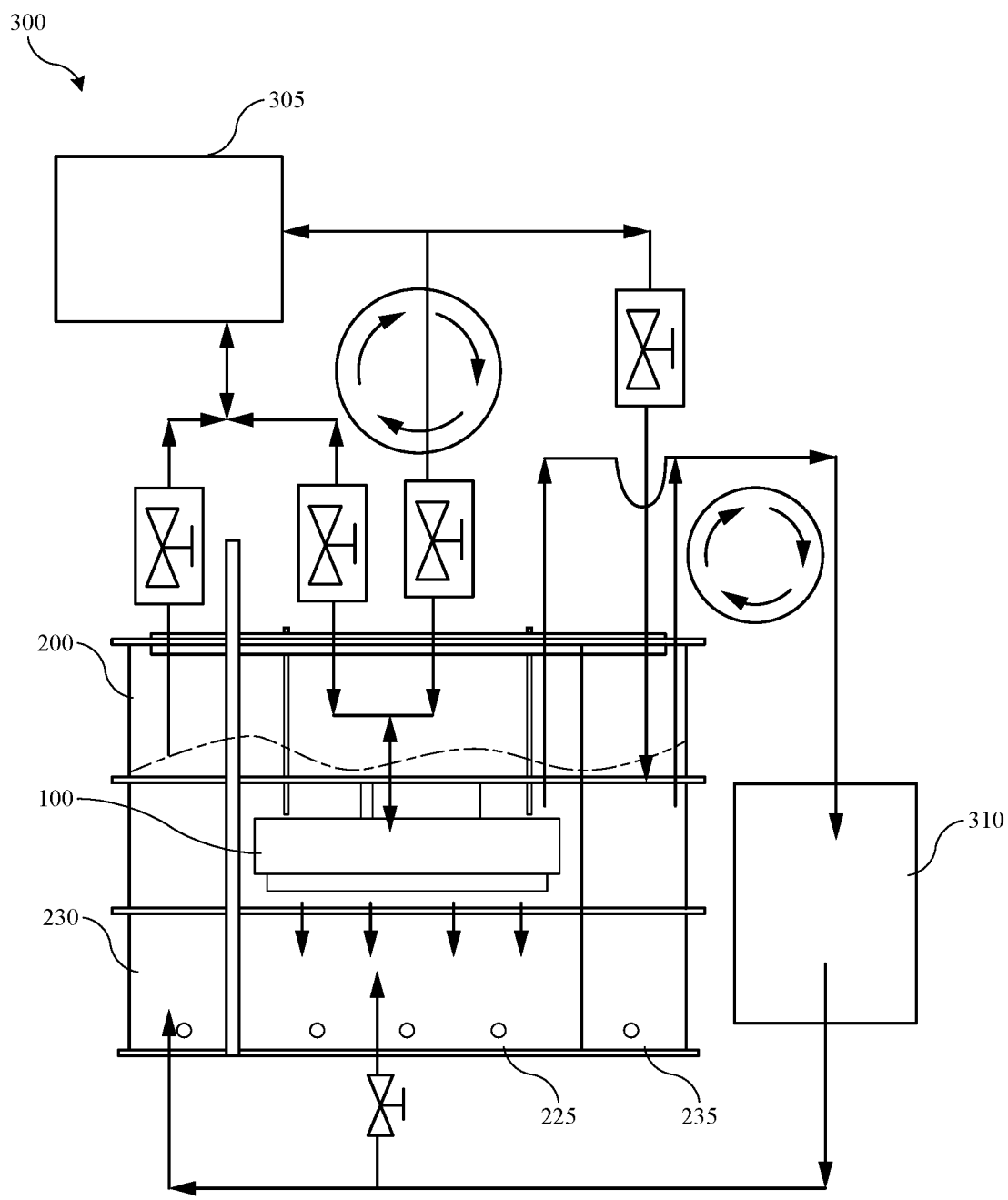
FIG. 3 shows a schematic cross-sectional view of components of an exemplary cleaning system according to some embodiments of the present technology.

Turning to FIG. 3 is shown a schematic cross-sectional view of components of an exemplary cleaning system 300 according to some embodiments of the present technology. Cleaning system 300 may include cleaning tank 200, which may incorporate receptacle 100, and which may be used to clean chamber components as previously described. Although a piping configuration is illustrated to describe cleaning operations that may be performed using the present technology, it is to be understood that systems encompassed by the present technology may include any number of components and configurations to distribute fluid throughout the system, as would be appreciated by the skilled artisan. The figure may illustrate aspects of a fluid delivery system, which along with a fluid testing system described below may form the general components incorporated within the cleaning system.

As shown, the fluid delivery system may incorporate components allowing bidirectional flow through the receptacle 100. For example, in one distribution loop, fluid may be pushed through the receptacle through the top lid, the component being cleaned, and the bottom lid. In a second distribution loop, fluid may be pulled through the receptacle through the bottom lid, the component being cleaned, and the top lid. These loops may be operated by selectively coupling a fluid delivery pump 305 with piping incorporated in the different sections of the cleaning tank 200. The cleaning system may include a filtration tank 310, which may filter particulate matter from cleaning fluid removed from the cleaning tank 200, and provide filtered cleaning fluid back to the tank for processing and continuing operation during a cleaning process.

For example, in a push cleaning operation, fluid delivery pump 305 may be engaged to draw fluid from a delivery section 230 of the cleaning tank, such as with valves incorporated in the piping scheme as illustrated. Pump piping, which may be illustrated as arrowed lines in the schematic, may couple the fluid delivery pump with each of the cleaning section 225, the delivery section 230, and the overflow section 235 of the cleaning tank as illustrated. The fluid may be pumped into the central aperture of receptacle 100 as described above, and may be forcibly flowed through apertures or channels of the component being cleaned. Filtration tank 310, which may include a separate pump, may withdraw fluid through receiving piping as illustrated from one or both of cleaning section 225 and/or overflow section 235, which may be fluidly accessible to cleaning section 225 to maintain a controlled fluid level in the chamber section during operation, or which may be receiving effluent fluid from a sample tank as will be described further below. The tank may include filters, agitators, separators, or other dispersal components which may be operated to remove particulate matter from the cleaning fluid withdrawn. For example, the filter may remove particulate matter extracted from the component being cleaned before delivering the cleaning fluid back to the tank. Delivery piping may then provide the filtered cleaning fluid back to the tank, and the piping may be coupled with each of the cleaning section 225 and the delivery section 230 in embodiments. Such an arrangement may afford delivery and retrieval in both a push and pull operation.

For example, in a push operation, fluid delivery pump 305 may draw filtered cleaning fluid from delivery section 230, and pump the fluid into the receptacle in cleaning section 225. A hose or piping may be threaded, snapped, or otherwise fit into a coupling in the central aperture of the top lid of the receptacle, which may seal the fluid path at the central aperture of the receptacle from the rest of the cleaning section of the tank. This may ensure that fluid is delivered in a single path through the receptacle, either forward or reversed through the aperture, and the fluid being delivered or withdrawn is maintained fluidly separate from the fluid within the tank. As fluid may be flushed through the receptacle and housed component, the cleaning fluid may draw particulate matter from the component, leaving effluent cleaning fluid in the chamber as the fluid flows from the receptacle. Filtration tank 310 may draw the effluent fluid from the cleaning section 225, and after performing filtration, may deliver the filtered cleaning fluid to the delivery section 230, closing the fluid loop on the operation, which may be run continuously for a period of time.

Similarly, in a pull operation, filtration tank 310 may deliver filtered cleaning fluid to the cleaning section 225, which may be pulled through the receptacle and component to be cleaned by fluid delivery pump 305, which may extract the water through a hose or piping coupled with the central aperture of the receptacle. This connection may be sealed, as the fluid being drawn may incorporate particulate matter. The fluid delivery pump may then pump this fluid into the overflow section 235, where filtration tank 310 may access and withdraw the effluent fluid for filtration and delivery back to cleaning section 225 to close the loop. These push and pull operations may be facilitated by the piping or fluid connections illustrated. One or more valves may be incorporated in each line between any components. Although only certain lines are illustrated including valves, it will be readily appreciated that any number of valves may be included in each and/or every line, which may be opened and closed to produce a push or pull delivery setup and fluid path through the system. Additionally, although the schematic arrows are illustrated through the top of the tank, it is to be understood that any of the fluid lines may be coupled with ports or fluid connections at each section of the cleaning tank as previously described.

Figure 4:
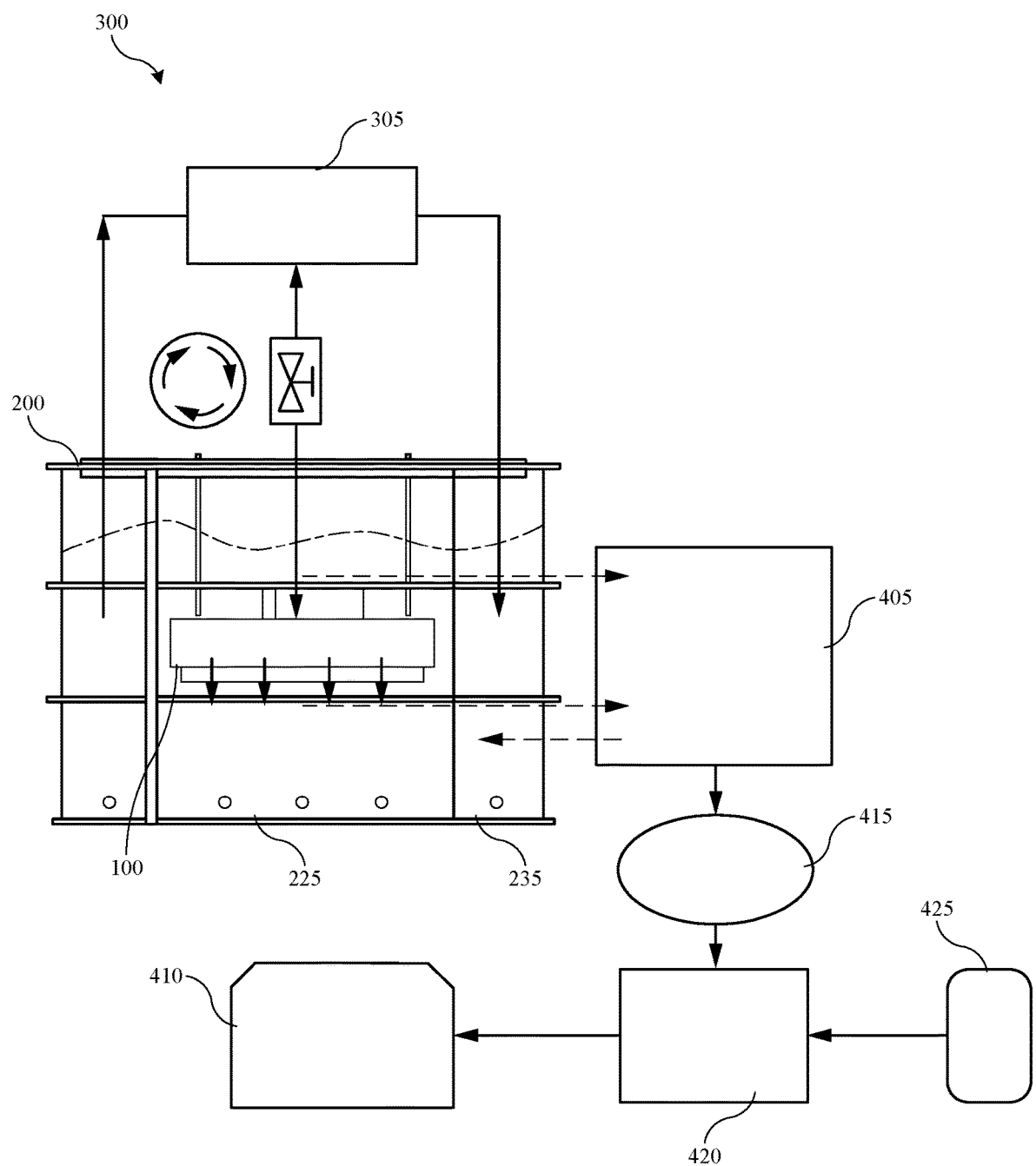
FIG. 4 shows a schematic cross-sectional view of components of an exemplary cleaning system according to some embodiments of the present technology.

FIG. 4 shows a schematic cross-sectional view of components of exemplary cleaning system 300 according to some embodiments of the present technology, and may illustrate additional components coupled as part of the cleaning system. For example, the figure may illustrate aspects of a fluid testing system, which along with the fluid delivery system described above may form the general components incorporated within the cleaning system. Although the figure is illustrated with most of the fluid delivery system components removed, it is to be understood that a cleaning system may include any or all of the components included in both figures.

Embodiments of the present technology may include a sampling or testing system that may be operated during cleaning operations to determine when particle removal has surpassed a threshold indicating a sufficiently clean component. A sampling tank 405 may be incorporated within the cleaning system, which may withdraw effluent fluid during processing operations, such as push or pull fluid delivery operations, and test the sample to determine particle incorporation. Coupled with the sampling tank may be a liquid particle counter 410, which may test the sampled fluid at certain intervals to determine when the process may be completed, or when thresholds of particle reduction have been surpassed. Because the sampling tank 405 may be operated during both push or pull operations, the tank may include multiple fluid connections into the cleaning section 225.

During push operations, clean or filtered cleaning fluid may be pumped into the central aperture of receptacle 100, and effluent water may flow into the cleaning section 225 of cleaning tank 200. Accordingly, during these operations, sampling tank 405, which may include a pump or other fluid delivery mechanisms, may draw water from the cleaning section 225 of the cleaning tank 200 with a receiving line of the testing system. During pull operations, clean or filtered cleaning fluid may be pumped into the cleaning section 225, and withdrawn through the central aperture of receptacle 100. Because the fluid path to or from the central aperture may be sealed, such as with a fluid coupling, piping, or hose, sampling tank 405 may be coupled with the fluid line coupled with the central aperture of the top lid of the receptacle, such as with an additional receiving line of the testing system. This may allow the sampling tank to withdraw effluent water as it is being pulled from the cleaning section of the chamber. The sampling tank may therefore include one or more receiving lines that are coupled with the cleaning tank both fluidly upstream and fluidly downstream of the receptacle. Put another way, the sampling tank may include one or more receiving lines that are coupled with the system to withdraw effluent water from an outlet of the receptacle, whether it is being operated in a push or pull fluid direction of flow.

The sampling system may form a fluid loop where fluid is distributed back into the cleaning tank 200, such as to the overflow section 235, which may allow the fluid to then be drawn into the filtration loop for cleaning, as the sampling system may be withdrawing only effluent water from the receptacle in some embodiments. From the sampling tank 405, a pump 415 may deliver sampled effluent cleaning fluid into a diluter 420 either continuously or at determined intervals for testing. The diluter 420 may incorporate additional fluid, such as deionized water, ultrapure water, or some other fluid, and deliver the diluted material to the liquid particle counter, which may determine a relative level of particulate material during cleaning operations. Once a threshold particulate count has been surpassed, a cleaning operation may be halted, or a component may be determined to be clean.

Figure 5:
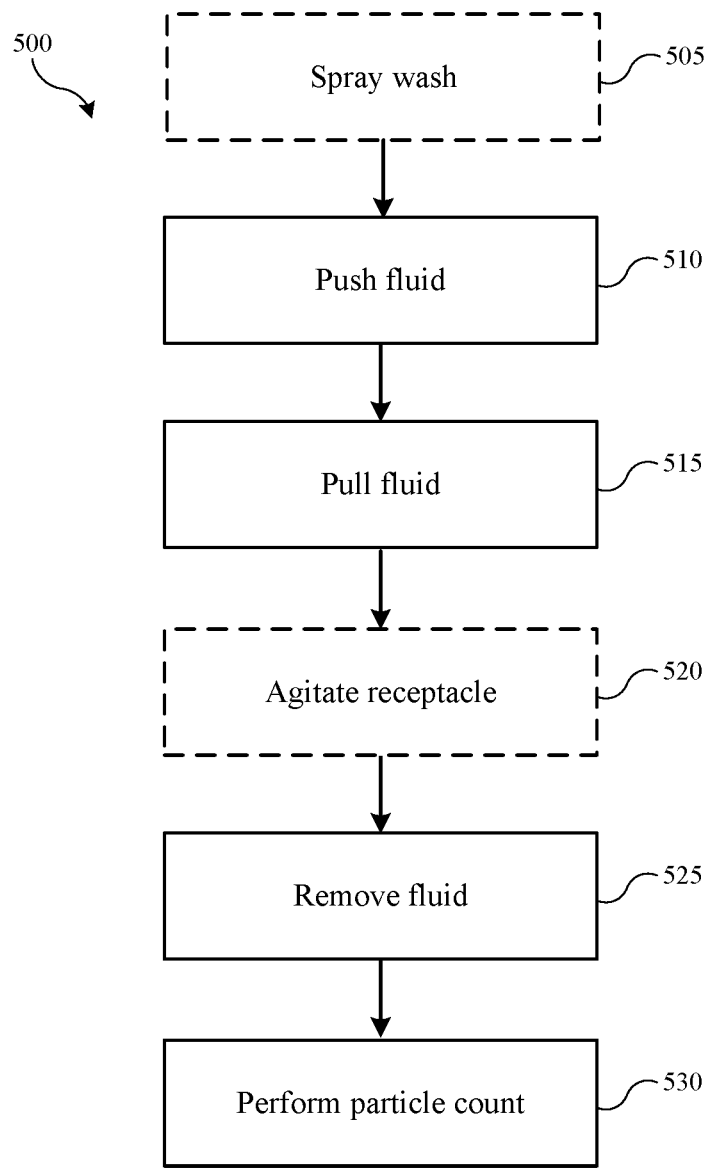
FIG. 5 shows exemplary operations in a component cleaning method according to some embodiments of the present technology Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

Although the remaining disclosure will discuss a faceplate cleaning process, it is to be understood that the present technology may be applied to any number of cleaning operations performed in any order to clean particulates from manufactured components. FIG. 5 shows exemplary operations in a component cleaning method 500 according to some embodiments of the present technology. The method may be performed in a variety of cleaning systems, including cleaning system 300 described above. Method 500 may include a number of optional operations, which may or may not be specifically associated with some embodiments of methods according to the present technology. For example, many of the operations are described in order to provide a broader scope of the technology, but are not critical to the technology, or may be performed by alternative methodology as would be readily appreciated. Additionally, although multiple operations may be described together, such as push and pull operations, it is to be understood that these operations may be performed in any order and in any number of iterations, or only one of the two operations may be performed in some embodiments of the present technology.

Method 500 may include additional operations prior to initiation of the listed operations. For example, additional cleaning operations may include residue removal, acid washing, or other material removal operations prior to initiating method 500. Prior processing operations may be performed in the chamber or system in which method 500 may be performed, or processing may be performed in one or more other processing chambers prior to delivering the component into the cleaning system in which method 500 may be performed. Regardless, method 500 may include spray washing a component at optional operation 505, which may be performed prior to positioning the component into a receptacle, such as receptacle 100 described above. The spray wash may include a high-pressure wash using any number of cleaning fluids known to clean manufactured components. The spray wash may be performed at pressures above or about 1,000 psi, and may be performed to specifically direct wash fluid through any apertures or channels that are to be further processed in a cleaning system, such as cleaning system 300 described above.

The component may be placed in a receptacle, such as receptacle 100 or some other receptacle, and disposed within a cleaning system, such as system 300 as described above. A cleaning fluid may be pushed through the receptacle at operation 510 in a fluid path forcing fluid through channels or apertures of the component being cleaned. The cleaning fluid may be continuously flowed through the component in a filtration loop as previously described for a first period of time. Additionally, a cleaning fluid may be pulled through the receptacle at operation 515 in a fluid path forcing fluid through channels or apertures of the component being cleaned. It is to be understood that either or both of operations 510 or 515 may be performed any number of times according to embodiments of the present technology, and either operation may be performed in any order. For example, in some embodiments cleaning fluid may be pulled through the component prior to fluid being pushed through the component. Additionally, in some embodiments the receptacle may be agitated within a cleaning section of a cleaning tank at optional operation 520. For example, a lifter or other device may raise and lower a mounting beam to which the receptacle may be coupled, which may cause agitation of fluid moving through the component. Because seals within the receptacle may limit or prevent fluid flow through the receptacle except through the component as described above, the additional agitation may further facilitate cleaning of the component.

A testing system as previously described may be used to remove a portion of the cleaning fluid from the cleaning tank or fluid line, such as extending from the central aperture of a top lid of the receptacle, at operation 525. The fluid removed may be cycled through or passed to a liquid particle counter at operation 530, where a determination may be made whether the particle count is below a threshold indicating the part is sufficiently clean of particulate matter that may impact processing operations. The cleaning fluid used may include any fluids or additives, and may include deionized water, ultrapure water, dilute acids, or any other fluid that may be used to clean the component. The cleaning fluid may be flowed at any rate through the component and receptacle in embodiments according to the present technology, which may facilitate dislodging and removing particulate matter from the component. For example, the flow rate in either direction may be greater than or about 4 liters per minute, and may be greater than or about 10 liters per minute, greater than or about 50 liters per minute, greater than or about 100 liters per minute, greater than or about 150 liters per minute, greater than or about 200 liters per minute, greater than or about 250 liters per minute, greater than or about 300 liters per minute, greater than or about 350 liters per minute, or more. By utilizing cleaning systems according to embodiments of the present technology, improved cleaning operations may be performed that may allow a reduction in fall-on particles during semiconductor processing.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a section" includes a plurality of such section, and reference to "the pump" includes reference to one or more pumps and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor chamber component cleaning system comprising:
 a receptacle comprising:
  a bottom lid comprising an annulus, wherein the annulus is characterized by an inner annular wall and an outer annular wall, and wherein a plurality of recessed annular ledges are defined between the inner annular wall and the outer annular wall, each recessed annular ledge of the plurality of recessed annular ledges formed at a different radial position along the bottom lid, and
  a top lid removably coupled with the bottom lid about an exterior region of the top lid; and
 a tank defining a volume to receive the receptacle.

2. The semiconductor chamber component cleaning system of claim 1, wherein the receptacle further comprises:
 a plurality of flexible seals, each seal of the plurality of flexible seals positioned along an associated recessed annular ledge of the plurality of recessed annular ledges; and
 a hermetic seal disposed between the bottom lid and the top lid.

3. The semiconductor chamber component cleaning system of claim 1, wherein the top lid further defines a plurality of apertures within an interior region of the top lid, the plurality of apertures including a central aperture defined through the top lid, wherein the receptacle further comprises:
 one or more studs extending through one or more apertures of the plurality of apertures defined within the top lid, the one or more apertures of the plurality of apertures separate from the central aperture defined through the top lid.

4. The semiconductor chamber component cleaning system of claim 1, wherein the bottom lid comprises a plurality of holders extending from the bottom lid, the semiconductor chamber component cleaning system further comprising:
 a mounting beam extending across the tank, wherein the mounting beam comprises a plurality of arms coupling the plurality of holders with the mounting beam.

5. The semiconductor chamber component cleaning system of claim 1, wherein the tank comprises a cleaning tank defining a plurality of sections, wherein the cleaning tank includes one or more walls fluidly separating the plurality of sections, the plurality of sections comprising:
 a cleaning section configured to receive the receptacle,
 a delivery section, and
 an overflow section.

6. The semiconductor chamber component cleaning system of claim 5, further comprising:
 a fluid delivery system comprising:
  a fluid delivery pump, and
  a filtration tank; and
 a fluid testing system comprising:
  a sampling tank, and
  a liquid particle counter.

7. The semiconductor chamber component cleaning system of claim 6, further comprising:
 pump piping coupling the fluid delivery pump with each of the cleaning section, the delivery section, and the overflow section of the cleaning tank.

8. The semiconductor chamber component cleaning system of claim 6, further comprising:
 filtration receiving piping coupling the filtration tank with each of the cleaning section and the overflow section of the cleaning tank; and
 filtration delivery piping coupling the filtration tank with each of the cleaning section and the delivery section of the cleaning tank.

9. The semiconductor chamber component cleaning system of claim 6, further comprising:
 a set of valves operable to configure the fluid delivery system in a push delivery fluid setup and a pull delivery fluid setup.

10. The semiconductor chamber component cleaning system of claim 6, wherein a receiving line of the sampling tank is fluidly coupled with the cleaning section of the cleaning tank both fluidly upstream and fluidly downstream from a position of the receptacle when incorporated within the cleaning tank.

11. The semiconductor chamber component cleaning system of claim 10, wherein a delivery line of the sampling tank is fluidly coupled with the overflow section of the cleaning tank.

* * * * *